United States Patent [19]

Gollomp

[11] 4,392,107

[45] Jul. 5, 1983

[54] SWITCHING EQUIPMENT FOR TESTING APPARATUS

[75] Inventor: Bernard P. Gollomp, Far Rockaway, N.Y.

[73] Assignee: The Bendix Corporation, Teterboro, N.J.

[21] Appl. No.: 185,452

[22] Filed: Sep. 9, 1980

[51] Int. Cl.³ ............................................. G01R 15/12
[52] U.S. Cl. .................................... 324/73 R; 371/25
[58] Field of Search ........... 324/73 R, 73 AT, 73 PC; 371/25

[56] References Cited

U.S. PATENT DOCUMENTS

| | | | |
|---|---|---|---|
| 2,473,685 | 6/1949 | Johansson | 324/73 R |
| 3,058,061 | 10/1962 | Smith | 324/73 R |
| 3,345,522 | 10/1967 | Reuther | 324/73 R |
| 3,357,007 | 12/1967 | Wike | 324/73 R |
| 3,370,232 | 2/1968 | Wickersham | 324/73 R |

Primary Examiner—Michael J. Tokar
Attorney, Agent, or Firm—Anthony F. Cuoco; Thomas L. Adams

[57] ABSTRACT

Switching equipment in a testing apparatus employs a common signal bus (B1, B2), a plurality of switching networks (14), a plurality of switching couplers (28, 30, 32) and a control device (40). The testing apparatus can measure with a plurality of instruments (26) the response of a unit under test (10), which unit has a plurality of test terminals (12). The switching networks (14) each have at least two active states. In each of its active states the switching networks (14) are operable to connect at least one of the plurality of test terminals (12) to the bus (B1, B2). Each of the networks has a selection input (24) operable to select its state. The switching couplers (28, 30, 32) each has a control terminal (34, 36, 38). Each also has a switched input connected to a different corresponding one of the instruments. Each of these couplers (28, 30, 32) is operable by its control terminal (34, 36, 38) to connect and disconnect its corresponding one of the instruments (26) to the bus (B1, B2). The control device (40) is connected to each of the switching networks (14) and couplers (28, 30, 32) for providing a separate signal to each selection input (24) and each control terminal (34, 36, 38). The control device (40) is operable for each of the test terminals (12) to connect it through the bus (B1, B2) to at least one of the instruments (26).

11 Claims, 6 Drawing Figures

U.S. Patent  Jul. 5, 1983  4,392,107
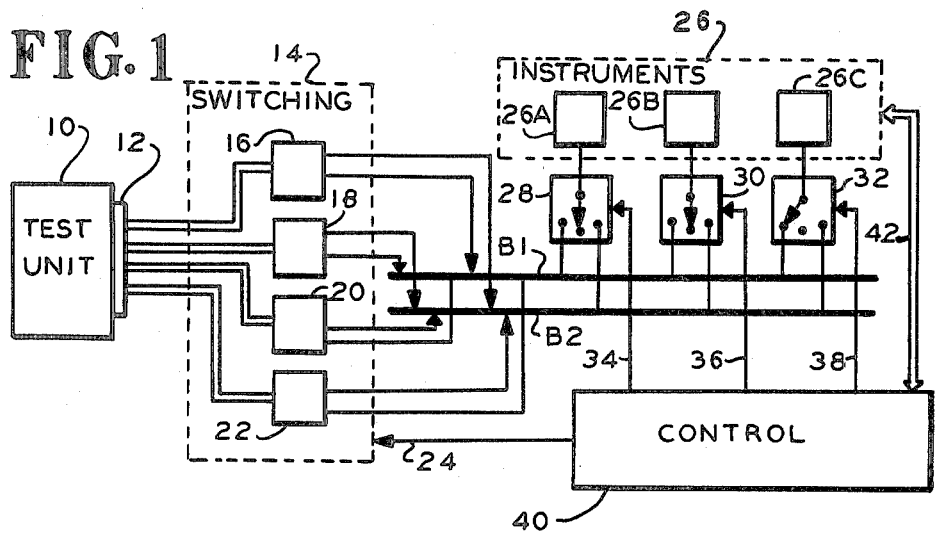
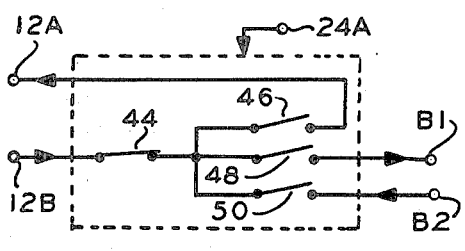
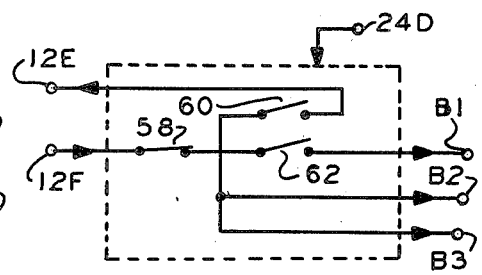
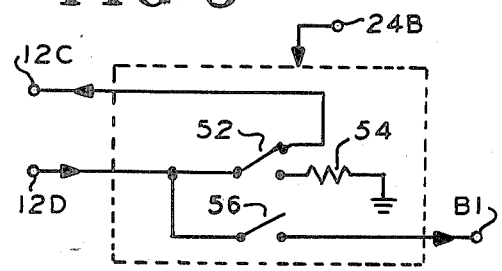
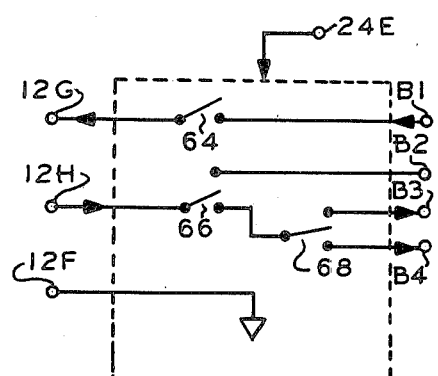
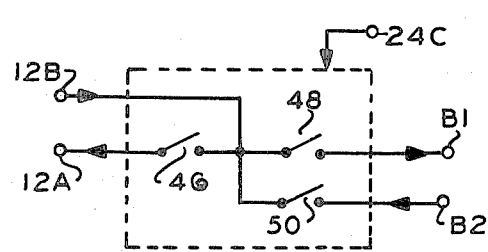

SWITCHING EQUIPMENT FOR TESTING APPARATUS

BACKGROUND OF THE INVENTION

The present invention relates to testing apparatus and, in particular, to equipment which uses a bus or buses to connect selected ones of a plurality of test instruments to test terminals of a unit under test.

It is known to employ an assemblege of test instruments which are selectively switched to stimulate and measure a unit under test. This assemblage test instrument is designed generally so that many different types of units may be tested. This generalization can reduce effectiveness and often results in complex switching.

It is also known to use in digital equipment a bus line over which many different signals may be time multiplexed. However, these buses do not meet the special requirements involved in testing a unit quickly and with great flexibility.

Accordingly, there is a need for flexible switching equipment which allows a plurality of test instruments to be efficiently coupled through a bus lines to a unit under test to perform certain predetermined tests.

SUMMARY OF THE INVENTION

In accordance with the illustrative embodiments demonstrating features and advantages of the present invention, there is provided in a testing apparatus, switching equipment. The testing apparatus can measure with a plurality of instruments the response of a unit under test, which unit has a plurality of test terminals. The switching equipment includes a common signal bus and a plurality of switching networks, each having at least two active states. In each of its active states the switching networks are operable to connect at least one of the plurality of test terminals to the bus. Each of the networks has a selection input operable to select its state. The equipment also includes a control means and a plurality of switching couplers. Each switching coupler has a control terminal and a switched input. Each switched input is connected to a corresponding one of the instruments. Each of the couplers is operable by its control terminal to connect and disconnect its corresponding one of the instruments to the bus. The control means is connected to each of the switching networks and couplers for providing a separate signal to each selection input and each control terminal. This control means is operable for each of the test terminals to connect it through the bus to at least one of the instruments.

Also, according to a related method of the present invention, bus lines are employed for measuring with a plurality of instruments the response of a unit under test. Again this unit has a plurality of test terminals. The method includes the step of connecting a pair of the test terminals together and, through the bus lines, to a first one of the instruments. The method also includes the steps of disconnecting the pair of test terminals and connecting, through the bus lines, a given one of the instruments to one of the pair of test terminals.

By employing the foregoing apparatus and method, improved switching equipment for testing apparatus is provided. Since the bus lines are switched at both ends and since the switching at the end between the test unit and the bus lines exhibits more than one active state, the foregoing apparatus can provide specially tailored testing of a specific unit without sacrificing flexibility. For example, in one embodiment a switching network includes a shunt switch which shorts together two test terminals of the unit under test to allow normal circulation of an internally generated signal. The junction of these two test terminals is then connected through the bus lines to a test instrument to measure parameters such as voltage, frequency, duty cycle etc. This switching network can also disconnect this pair of test terminals so that a precise voltage or current can be substituted for the internally generated signal and the effect on the circuit then measured.

In another embodiment, a switching network contains a load element which can be substituted for the load within a unit under test. Thus, the loading effects inside the unit under test can be measured under normal or precision load.

In other embodiments a switching network can route a test terminal to one or many bus lines.

Equipment according to the foregoing principles has numerous applications for testing various electronic, mechanical and other apparatus. In addition, it is expected that the present equipment will have great flexibility so that many different types of units can be satisfactorily tested. Also, it is expected that the foregoing equipment will have applications in the automotive art for testing the operation of the electrical power system, the electronic ignition and/or the high voltage spark system of an automobile.

BRIEF DESCRIPTION OF THE DRAWINGS

The above brief description as well as other objects, features and advantages of the present invention will be more fully appreciated by reference to the following detailed description of presently preferred but nonetheless illustrative embodiments in accordance with the present invention when taken in conjunction with the accompanying drawings wherein:

FIG. 1 is a schematic illustration of testing apparatus according to the present invention;

FIG. 2 is a schematic illustration of a switching network which may be employed in the apparatus of FIG. 1;

FIG. 3 is a schematic illustration of another switching network which may be used in the apparatus of FIG. 1;

FIG. 4 is a schematic illustration of another switching network which may be used in the apparatus of FIG. 1;

FIG. 5 is a schematic illustration of a switching network which is an alternate to those of FIG. 1; and FIG. 6 is a schematic illustration of a switching network which is an alternate to those of FIG. 1.

DETAILED DESCRIPTION OF THE PREFERRED EMBODIMENTS

Referring to FIG. 1, a testing apparatus is shown for testing unit 10. Unit 10 has a plurality of test terminals at its connector 12. Test terminals 12 are connected to a plurality of switching networks 14 shown herein as switching devices 16, 18, 20 and 22. A bus line is shown herein as a plurality of lines B1 and B2. While two such lines are shown in this illustration, it is to be understood that a different number can be employed in other embodiments, depending upon the expected measurement complexity and the number of simultaneous measurements to be performed. In this embodiment each of the switching devises 16–22 have a pair of output terminals which are separately connected to bus lines B1 and B2. It is to be appreciated that for embodiments employing more than two bus lines switching devices 16-22 may have more than two output lines. Also groups of switching devices can be segregated and routed through dedicated bus lines. Also, in this embodiment each of the switching devices 16-22 has a pair of input lines separately connected to a pair of terminals among the plurality of terminals 12. In other embodiments the switching devices 16-22 may have a different number of inputs depending upon the type of measurement being performed thereby. Furthermore, some embodiments may connect one or more of the switching devices to a common set of test terminals. A selection input 24, at the plurality of switching networks 14, is used to transfer, individually or in combination, different ones of switching devices 14 between its active states. These active states will be described in further detail hereinafter.

A plurality of test instruments 26 is shown herein as blocks 26A, 26B and 26C. These instruments may include a precision voltage source, a precision current source, a digital voltmeter, a digital ammeter, a frequency counter, a pulse width measuring instrument, an impedance meter or other equipment as may be required to perform the expected tests. Each of the instruments 26A, 26B and 26C is separately connected to the pole of one of a plurality of switching couplers, specially three, triple positions switches 28, 30, 32, respectively. Each of the couplers 28-32 has two of its fixed contacts separately connected to bus lines B1 and B2, its remaining fixed contact being a neutral position for isolating its respective instrument from bus lines B1 and B2. Couplers 28, 30 and 32 have control terminals 34, 36 and 38, respectively. Signals applied to terminals 34-38 operate its respective coupler.

A control means is shown herein as a microcomputer-controlled device 40 having outputs connected to terminals 34, 36, and 38 and input 24. In this embodiment the control device operates to sequence the various switching networks and switching couplers to cause a succession of connections between various ones of test terminals 12 to various ones of the instruments 26. The sequence, rate and duty cycle of such interconnections follows a predetermined pattern stored in memory within control device 40. In this embodiment, control device 40 also exchanges digital data with instruments 26 along bus 42. For example, control device 40 may transmit a digital signal to one of these instruments 26 to command a power supply to provide a predetermined voltage or current. Also, instruments within instrument group 26 may transmit to control device 40 a digital signal signifying the magnitude of a measured parameter. Also, in this embodiment control device 40 responds to the measured parameter to alter the pattern of measurements. For example, should the measurement performed by one of the instruments 26 indicate a failure of unit 10, the other intended measurements may be aborted. Alternatively, certain diagnostic subroutines may be implemented when a specific failure has been detected by instruments 26. This diagnostic subroutine may be a predetermined pattern of measurements designed to narrowly define the specific nature of the failure. It is to be appreciated that various programs may be implemented to perform the various tests and measurements appropriate for the unit under test. The number, sequence and type of test performed can therefore be readily modified by the expedient of reprogramming.

Referring to FIG. 2, a more detailed schematic is given of switching device 16 of FIG. 1. In this schematic a pair of switching devices is shown as normally closed switch 44 and normally open switch 46. Switches 44 and 46 are shown serially connected between terminals 12A and 12B which are members of the test terminals 12 of FIG. 1. A switching element is shown herein as a pair of normally open switches 48 and 50. Switch 48 is shown connected between the junction of switches 44 and 46 and previously mentioned bus line B1 and switch 50 is shown connected between that junction and previously mentioned bus line B2. Switches 44 and 46 may be closed to route an internal signal appearing at terminal 12B back to terminal 12A. If switch 48 is closed at this time a measurement of voltage, frequency, etc. may be performed by an appropriate test instrument through bus line B1. Also, switch 44 or 46 may be opened so that an open circuit measurement may be performed at terminal 12A or 12B, respectively. Also, switch 50 may be closed to inject from line B2 a precison stimulus, the response produced being measured at line B1.

The foregoing switches may be operated individually or in combination by signals applied to selection input 24A. In this embodiment, input 24A is a plurality of lines connected to relay coils for controlling each switching element. However, in other embodiments the switching elements may be semiconductor switches controlled by digital signals, applied to input 24A.

Referring to FIG. 3, an alternate switching network is illustrated employing a transfer switch shown herein as single pole, double throw switch 52 having its pole connected to terminal 12D, one of the test terminals 12 of FIG. 1. Another one, test terminal 12C, is shown connected to a fixed contact of transfer switch 52, the other fixed contact being connected to one terminal of load element 54, whose other terminal is grounded. A coupling switch is shown herein as switch 56 connected between test terminal 12D and previously mentioned line B1.

Also, a control input 24B is shown herein which operates in a manner similar to input 24A of FIG. 2. It will be appreciated that if transfer switch 52 is in the position illustrated, it connects test terminal 12C to terminal 12D so an internal signal generated within the unit under test can be returned thereto. Coupling switch 56 may also be closed so that a measurement at terminal 12D (and if connected thereto terminal 12C) may be performed by a test instrument connected thereto by bus line B1. Thereafter, switch 52 may be transferred to the opposite position so that the connection between terminals 12C and 12D is interrupted and a precision load 54 is connected to terminal 12D. Under the latter circumstances, the voltage drop across precision load 54 can then be measured through bus line B1.

Referring to FIG. 4, an alternate switching network similar to that of FIG. 2 is illustrated except that in this embodiment previously illustrated switch 44 is replaced by a short circuit. This latter embodiment is useful for test situations wherein isolation of test terminal 12B is not required.

As previously mentioned, in some embodiments three or more bus lines may be employed. The switching network of FIG. 5 is provided for a three line system. In this embodiment normally closed switch 58 and normally open switch 60 are serially connected between test terminals 12E and 12F. Also, connected to the junction of switches 58 and 60 and bus lines B3 and B2 is one terminal of switch element 62, whose other terminal connects to bus line B1. Accordingly, the signals at the junction of switches 58 and 60 can be simultaneously measured by three instruments at lines B1, B2 and B3 to record, for example, voltage, frequency and pulse duration. Again, the operation of the various switches herein is controlled by a control input 24D in a manner similar to that previously described.

Referring to FIG. 6, another switching network for a four bus line system is illustrated which is designed to connect test terminal 12H to one of the three bus lines identified herein as bus lines B2, B3 and B4. This network includes a switching device 64 connected between test terminal 12G and bus B1. Also, test terminal 12H is connected to the pole of transfer switch 66 which switches between bus line B2 and the pole of switch 68. The latter switch switches between bus line B3 and bus line B4. It will be appreciated that switches 66 and 68 comprise a form of combinational switching logic whereby the signal on terminal 12H can be measured by an instrument on any one of the three bus lines B2, B3 or B4. The measurement may be in response to an external stimulus injected from bus line B1 into test terminal 12G. Test terminal 12F is connected to a local ground to maintain a common ground with the test instruments. Again these switches are controlled by control input 24E in a manner similar to that previously described.

To facilitate an understanding of the principles associated with the foregoing apparatus the operation of the equipment of FIG. 1 will be briefly described. In this description it will be assumed that the switching network of FIG. 2 is contained in each of the switching networks 16–22 of FIG. 1. Initially the unit 10 is connected to the plurality of switching networks 14 through its connector 12. Thereafter control device 40 transmits a signal on control input 24 to operate switching networks 18, 20 and 22 so that each shorts together its pair of inputs and open circuits its outputs. Referring to FIG. 2, this situation corresponds to switches 44 and 46 being closed while switches 48 and 50 are open. At the same time control device 40 operating through control input 24 causes switching network 16 to transfer signals through to bus line B1, B2. First, switches 44, 46, and 48 (FIG. 2) are closed. Under these circumstances, an internal signal on terminal 12B is returned to an internal load on terminal 12A so that the normal voltage, appearing at the junction of switches 44 and 46, can be measured through bus line B1. Subsequently, this voltage is coupled by coupler 32 (FIG. 1) to instrument 26C and it consequently transmits along data line 42 a measured response which is recorded by control device 40. If this response meets preset standards stored in control device 40, it will then command the next test in the sequence.

Next, control device 40 causes switching network 16 to open its switch 46 (FIG. 2) to measure the unloaded signal being provided from test terminal 12B. Thereafter, switch 44 opens and switch 46 closes so that the residual voltage on the load of terminal 12A can be measured. Alternatively the impedance of this load can be measured. Subsequently, switch 50 closes. Simultaneously, control device 40 drives switching coupler 30 to connect instrument 26B, a precision signal source, to bus line B2. Consequently, an external stimulus is applied through switch 50 (FIG. 2) to the load at terminal 12A and the voltage appearing thereat is measured by instrument 26C through bus line B1. Thereafter, the measurement obtained by instrument 26C is transmitted along data line 42 to control device 40. If this measurement now compares satisfactorily to the standards stored in control device 40, it proceeds to the next test in sequence. Subsequently, switches 44 and 46 (FIG. 2) close to restore the normal connection between terminals 12A and 12B. Also, switches 48 and 50 open to disconnect network 16 (FIG. 1) from the bus lines.

The subsequent relevant operations occur within switching network 18. Switching network 18, which is constructed and same as network 16, now operates in a manner similar to that described in connection with switching network 16. When the operations of network 18 cease, similar operations are provided by switching network 20, followed by switching network 22.

It is to be appreciated that one of the foregoing switching networks may be constructed as shown in FIGS. 3–6. For example, if the network of FIG. 3 is employed, the relevant test operation will be that of measuring a signal under normal load and under a precision load. The manner in which the switching network of FIG. 3 accomplishes such an effect has already been described and will not be presently repeated. Similarly, the switching operation of the network of FIGS. 4–6 were also previously described and therefor will not be repeated.

It is to be appreciated that various modifications may be implemented with respect to the above described embodiments. For example, numerous switching circuits having more than one active state may be substituted for those previously described. Also, it is to be appreciated that these switching networks can have sufficient flexibility to test various types of units. For some embodiments it is anticipated that the switching network of FIG. 6 can be connected to the high voltage lines of an automobile ignition and that the other switching networks may be connected to various electrical systems within such an automobile. Also, while microprocessors have been described it will be appreciated that other types of control may be used to sequence tests including manual controls. Also, the various switching devices may be relays, semiconductor switches or other switching elements known in the art. Furthermore, the number of bus lines can be altered depending upon the expected complexity and the number of simultaneous measurements and stimulations. Similarly, the number and type of instruments employed and the number of switching networks can be altered depending upon the testing procedure.

Obviously, may other modifications and variations of the present invention are possible in light of the above teachings. It is therefore to be understood that within the scope of the appended claims, the invention may be practiced otherwise than as specifically described.

What is claimed is:

1. In a testing apparatus for measuring with a plurality of instruments the response of a unit under test, which unit has a plurality of test terminals, switching equipment comprising:
a common signal bus;
a plurality of switching networks, each having at least two active states, in each of its active states said switching networks being operable to connect at least one of said plurality of test terminals to said bus, each of said networks having a selection input operable to select its states;
a plurality of switching couplers each having a control terminal and each having a switched input connected to a different corresponding one of said instruments, each of said couplers being operable by its control terminal to connect and disconnect its corresponding one of said instruments to said common signal bus; and control means connected to each of said switching networks and couplers for providing a separate signal to each selection input and each control terminal, said control means being operable for each of said test terminals to connect it to at least one of said instruments through one of said switching networks, said bus and one of said switching couplers, said control means being operable to substitute one of said instruments for another so that said common bus can be time shared.

2. In a testing apparatus according to claim 1 wherein a given number of said switching networks includes:

a switching device connected between a corresponding pair of said test terminals for alternatively isolating them and connecting them together, said device being operated in response to a signal from said control means.

3. In a testing apparatus according to claim 2 wherein said switching device includes:

a switching element connected between said bus and one of said corresponding pair of test terminals, said element being operated in response to a signal from said control means.

4. In a testing apparatus according to claim 1 wherein one of said switching networks comprises:

a pair of switching devices responsive to a signal from said control means and serially connected between a corresponding pair of said test terminals, said switching devices being operable by said control means to switch at different times; and a switching element responsive to a signal from said control means and connected between said bus and the junction of said pair of switching devices.

5. In a testing apparatus according to claim 1 wherein one of said switching networks includes:
a load element; and a transfer switch connected to said load element for connecting and disconnecting a given pair of said test terminals, said transfer switch being operable to disconnect said given pair and connect a predetermined one of them to said load element in response to a signal from said control means.

6. In a testing apparatus according to claim 5 wherein said transfer switch includes:

a coupling switch connected between said bus and said predetermined one of said given pair of said test terminals, said coupling switch operating in response to a signal from said control means.

7. In a testing apparatus according to claim 1, 2 or 3 wherein said bus comprises a plurality of lines.

8. In a testing apparatus according to claim 7 wherein each of said switching couplers is operable to switch its instrument between or from at least two of said lines of said bus in response to a signal from said control means.

9. In a testing apparatus according to claim 3 wherein said bus comprises a plurality of lines and wherein said switching element comprises:

a pair of switches each connected between said one of said corresponding pair of test terminals and a different one of said lines of said bus.

10. In a testing apparatus according to claim 1 wherein said bus comprises a plurality of lines and wherein one of said networks comprises:

a switching device connected to one of said test terminals for coupling it to one of three lines of said bus.

11. A method employing bus lines for measuring with a plurality of instruments the response of a unit under test, said unit having a plurality of test terminals, said method including the steps of:

connecting a pair of said test terminals together and, through said bus lines, to a first one of said instruments;

isolating said pair of said test terminals;

connecting through said bus lines a given one of said instruments to one of said pair of test terminals; and connecting through said bus lines a different one of said instruments to a different one of said test terminals.

* * * * *